US012566413B2

(12) United States Patent
Park

(10) Patent No.: US 12,566,413 B2
(45) Date of Patent: Mar. 3, 2026

(54) TEACHING METHOD OF TRANSFER EQUIPMENT AND TEACHING PROCESSING SYSTEM OF TRANSFER EQUIPMENT

(71) Applicant: SEMES CO., LTD., Cheonan-si (KR)

(72) Inventor: Chang Jun Park, Pyeongtaek-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 245 days.

(21) Appl. No.: 18/147,299

(22) Filed: Dec. 28, 2022

(65) Prior Publication Data

US 2023/0205147 A1     Jun. 29, 2023

(30) Foreign Application Priority Data

Dec. 29, 2021   (KR) ........................ 10-2021-0191555
Oct. 4, 2022   (KR) ........................ 10-2022-0126631

(51) Int. Cl.
*G05B 13/02*          (2006.01)
*B25J 9/16*          (2006.01)
(Continued)

(52) U.S. Cl.
CPC ........ *G05B 13/0265* (2013.01); *B25J 9/1666* (2013.01); *B25J 9/1697* (2013.01);
(Continued)

(58) Field of Classification Search
CPC .... G05B 13/0265; G05B 19/42; B25J 9/1666; B25J 9/1697; B25J 9/1664; G06T 7/73;
(Continued)

(56) References Cited

U.S. PATENT DOCUMENTS 11,289,350 B2 *   3/2022   Aburatani ......... H01L 21/67742
11,437,257 B2 *   9/2022   Moriya ............. H01L 21/67742
(Continued)

FOREIGN PATENT DOCUMENTS

JP        2008-080466 A      4/2008
JP          6479264 B2 *   3/2019   .............. B25J 19/06
(Continued)

OTHER PUBLICATIONS

Office Action for Korean Application No. 10-2022-0126631 dated Mar. 29, 2024.

*Primary Examiner* — Nhi Q Bui
(74) *Attorney, Agent, or Firm* — Harness, Dickey & Pierce, P.L.C.

(57) ABSTRACT

The present invention provides a teaching method of transfer equipment. The teaching method of transfer equipment comprises: a) installing a transfer robot in a groove position of a transfer chamber in which transfer target objects with a transferred object transferred are arranged; b) acquiring a first image through a vision camera installed in the transfer robot in a home position, reading the acquired image data, specifying the transfer target object preset to a teaching target, and deriving a first position coordinate for the transfer target object; c) moving the transfer robot to a position corresponding to the first position coordinate; and d) acquiring a second image for the transfer target object through the vision camera from the first position coordinate, and deriving a second position coordinate by reading the acquired image data.

8 Claims, 10 Drawing Sheets

(51) Int. Cl.
_G06T 7/73_ (2017.01)
_H01L 21/68_ (2006.01)
_H01L 21/687_ (2006.01)

(52) U.S. Cl.
CPC .............. _G06T 7/73_ (2017.01); _H01L 21/681_
(2013.01); _H01L 21/68707_ (2013.01); _G06T_
_2207/20081_ (2013.01); _G06T 2207/30148_
(2013.01); _G06T 2207/30204_ (2013.01)

(58) Field of Classification Search
CPC . G06T 2207/30148; G06T 2207/30204; G06T
2207/20081; H01L 21/681; H01L
21/68707; H01L 21/67259; H01L
21/67742; H01L 21/6776; H01L
21/67766; H01L 21/67778
See application file for complete search history.

(56) References Cited

U.S. PATENT DOCUMENTS

| | | | | |
|---|---|---|---|---|
| 2004/0243282 | A1* | 12/2004 | Watanabe | G06T 1/0014 |
| | | | | 700/259 |
| 2019/0378740 | A1* | 12/2019 | Isokawa | H01L 21/67196 |
| 2020/0134326 | A1* | 4/2020 | Boev | B60W 40/072 |
| 2021/0197389 | A1* | 7/2021 | Hsieh | G06F 18/25 |
| 2021/0251454 | A1* | 8/2021 | Lee | G01C 21/20 |
| 2021/0335636 | A1* | 10/2021 | Mori | H01L 21/67742 |

FOREIGN PATENT DOCUMENTS

| | | |
|---|---|---|
| KR | 10-2007-0117810 A | 12/2007 |
| KR | 10-2021-0070505 A | 6/2021 |

* cited by examiner

TEACHING METHOD OF TRANSFER EQUIPMENT AND TEACHING PROCESSING SYSTEM OF TRANSFER EQUIPMENT

CROSS-REFERENCE TO RELATED APPLICATIONS

This application claims priority to and the benefit of Korean Patent Application No. 10-2021-0191555 and 10-2022-0126631 filed in the Korean Intellectual Property Office on Dec. 29, 2021, and Oct. 4, 2022, the entire contents of each of which are incorporated herein by reference.

TECHNICAL FIELD

The present invention relates to a teaching method of transfer equipment and a teaching processing system of transfer equipment.

BACKGROUND ART

When manufacturing a semiconductor device, a processing system including a transfer device that transfers a substrate for a plurality of modules is used. In the processing system, a teaching operation of the transfer device is performed to precisely transfer the substrate within each module.

As the teaching operation of the transfer device, a method of manually designating a teaching position while an operator observes visually using an alignment jig after executing rough alignment has been known. Such a manual teaching method has problems in that a safety accident may occur and it may take a long time to finish a task because the operator needs to perform the operation inside the chamber.

SUMMARY OF THE INVENTION

The present invention has been made in an effort to provide a teaching method of transfer equipment and a teaching processing system of transfer equipment capable of precise teaching through vision image processing.

The present invention has also been made in an effort to provide a teaching method of transfer equipment and a teaching processing system of transfer equipment which can reduce teaching work time.

The object of the present invention is not limited thereto, and other objects not mentioned will be clearly understood by those of ordinary skill in the art from the following description.

An exemplary embodiment of the present invention provides a teaching method of transfer equipment, including: a) installing a transfer robot in a groove position of a transfer chamber in which transfer target objects with a transferred object transferred are arranged; b) acquiring a first image through a vision camera installed in the transfer robot in a home position, reading the acquired image data, specifying the transfer target object preset to a teaching target, and deriving a first position coordinate for the transfer target object; c) moving the transfer robot to a position corresponding to the first position coordinate; and d) acquiring a second image for the transfer target object through the vision camera from the first position coordinate, and deriving a second position coordinate by reading the acquired image data.

According to the exemplary embodiment, at least one reference mark may be displayed on the transfer target object, and in step b) and step d) above, position coordinates may be derived based on the reference mark when reading the image data.

According to the exemplary embodiment, in step b) and step d) above, the image data may derive the position coordinates through an ADAS image technique.

According to the exemplary embodiment, the transfer target object may include a plurality of slots in which the transferred object is loaded, and in step d) above, the second position coordinate may include the position coordinates for each slot.

According to the exemplary embodiment, the transfer target object may include an end effector on which the transferred object is seated, and the method may further include: e) a test step of loading or unloading the transferred object in/from the slots of the transfer target object by the end effector along the position coordinates for each slot after step d) above.

According to the exemplary embodiment, after completing the test step, the transfer target object may be returned to the home position, and then, a transfer target object set to a teaching target may be specified and steps b) to e) above are repeatedly performed.

According to the exemplary embodiment, a teaching operation may be performed in the end effector of the transfer robot in a state in which a dummy substrate is seated in the end effector instead of the transferred object.

Another exemplary embodiment of the present invention provides a transfer position teaching system of a transfer robot comprising: a vision camera installed on an arm of a transfer robot disposed in a home position of a transfer chamber and configured to acquire and output a first image in which a surrounding area is photographed; an image analysis unit configured to read the first image acquired from the vision camera to identify a transfer target object preset to a teaching target object and generate a first position coordinate in which the transfer robot can be located in front of the identified transfer target object; and a controller configured to control a movement of the transfer robot along the first position coordinate received from the image analysis unit.

According to the exemplary embodiment, the vision camera may acquire and output a second image in which the transfer target object is photographed when the transfer robot is disposed in the first position coordinate, and the image analysis unit may read the second image and generates a second position coordinate, and the controller may control a movement of the transfer robot along the second position coordinate received from the image analysis unit.

According to the exemplary embodiment, the transfer target object may include at least one reference mark, and the image analysis unit may derive position coordinates based on the reference mark when reading the image.

According to the exemplary embodiment, the image analysis unit may derive the position coordinates through an advanced driver assistance system (ADAS) image technique.

According to the exemplary embodiment, the transfer target object may include a plurality of slots on which a substrate is loaded, and the second position coordinate may include the position coordinates for each slot.

According to the exemplary embodiment, the controller may control a movement of the transfer robot such that the transfer robot performs a loading or unloading operation of the substrate in/from the slots of the transfer target object along the position coordinates for each slot.

According to the exemplary embodiment, the transfer position teaching system of a transfer robot may further include a sensor unit installed in the arm of the transfer robot and configured to sense a collision of the arm with a peripheral facility in advance, and the controller may interrupt a teaching operation of the transfer robot when a collision sensing signal is output from the sensor unit.

According to the exemplary embodiment, the sensor unit may include at least one selected from the group consisting of a lidar, a radar and an ultrasonic sensor.

Still another exemplary embodiment of the present invention provides a teaching method of a transfer position of a transfer robot for a transfer container, comprising: a) positioning the transfer robot in a home position in a transfer chamber where the transfer containers are seated in a load port; b) acquiring a first image through a vision camera installed in the transfer robot in the home position, reading the acquired image data, specifying a transfer container preset to a teaching target object, and deriving a first position coordinate for the transfer container, c) moving the transfer robot to a position corresponding to the first position coordinate; and d) acquiring a precise image for the transfer container from the first position coordinate through the vision camera, reading the acquired image data, and deriving a second position coordinate including slot-specific position coordinates in the transfer container; e) loading or unloading a substrate in/from slots of the transfer container by the transfer robot along the slot-specific position coordinates; and f) returning the transfer robot that has completed a teaching operation of the transfer container, to the home position, specifying a transfer target object set to a subsequent teaching target object, and repeatedly performing steps b) to e) above.

According to the exemplary embodiment, the transfer container may include at least one reference mark, and in step b) and step d) above, the position coordinates may be derived based on the reference mark when reading the image data.

According to the exemplary embodiment, in step b) and step d) above, the image data may derive the position coordinates through an ADAS image technique.

According to the exemplary embodiment, the transfer robot may perform teaching operation in a state in which a dummy substrate is seated in an end effector of the transfer robot.

According to the exemplary embodiment, in step e) above, a sensor unit mounted in the end effector of the transfer robot may sense a collision with a peripheral facility in advance.

According to the exemplary embodiment of the present invention, when positioning (i.e., teaching) a movement target of an index robot, high-precision positioning can be automatically performed through vision image processing using an ADAS technique, preventing safety accidents that may occur in manned tasks in facilities and minimizing work time.

DETAILED DESCRIPTION

Figure 1:
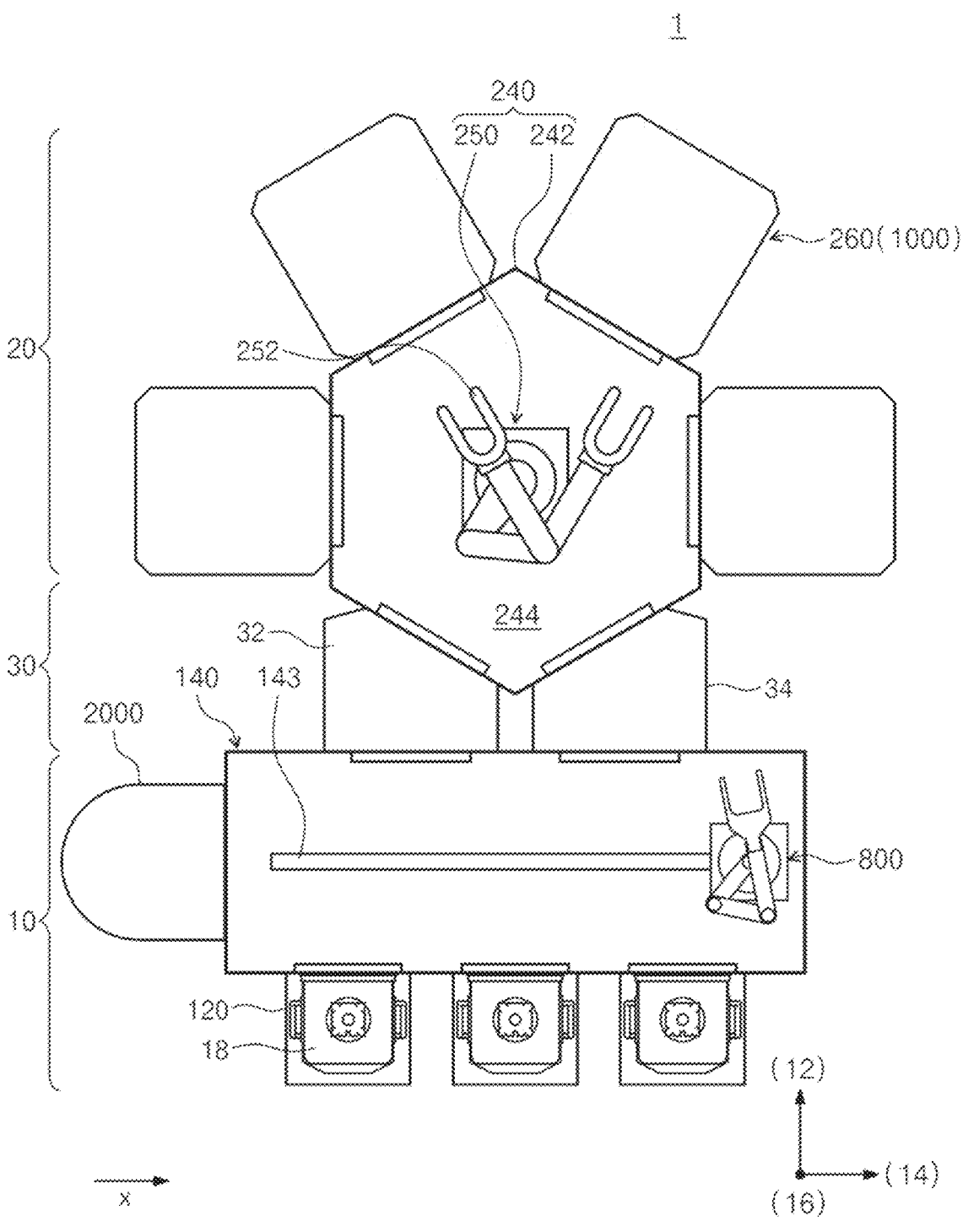
FIG. 1 is a top plan view schematically illustrating a substrate processing apparatus according to one embodiment of the present invention.

Hereinafter, an exemplary embodiment of the present invention will be described in detail with reference to the accompanying drawings so that those skilled in the technical field to which the present invention pertains may easily carry out the exemplary embodiment. However, the present invention may be implemented in various different ways, and is not limited to exemplary embodiments described herein. In describing the present invention, a detailed description of known functions and configurations will be omitted when it may obscure the subject matter of the present invention. Like numbers refer to like elements throughout the description of the figures.

Unless explicitly stated to the contrary, the word "comprise," "comprises" or "comprising" used throughout the specification will not be understood as the exclusion of the other elements but to imply the inclusion of the other elements. Specifically, the term "include," "comprise," "including," or "comprising," specifies a property, a region, a fixed number, a process, an element and/or a component hut does not exclude other properties, regions, fixed numbers, processes, elements and/or components.

In this specification, the singular also includes the plural unless specifically stated otherwise in the phrase. In the drawings, the shapes and dimensions of elements may be exaggerated for clarity.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The foregoing detailed description illustrates the present disclosure. Also, the foregoing is intended to illustrate and explain the preferred embodiments of the present disclosure, and the present disclosure may be used in various other combinations, modifications, and environments. That is, it is possible to make changes or modifications within the scope of the concept of the above-described disclosure, within an equivalent scope to the above-described disclosure, and/or within the skill or knowledge of the art. The above-described embodiments illustrate the best mode for carrying out the technical idea of the present disclosure, and various modifications may be made in the specific applications and uses of the present disclosure. Therefore, the detailed description of the present disclosure is not intended to limit the present disclosure to the disclosed embodiments. It is also to be understood that the appended claims are construed to cover further embodiments.

In the exemplary embodiment of the present invention, a substrate processing apparatus for etching a substrate using plasma will be described. However, the present invention is not limited thereto, and may be applied to various types of devices in which a transfer robot is installed in a chamber.

Figure 2:
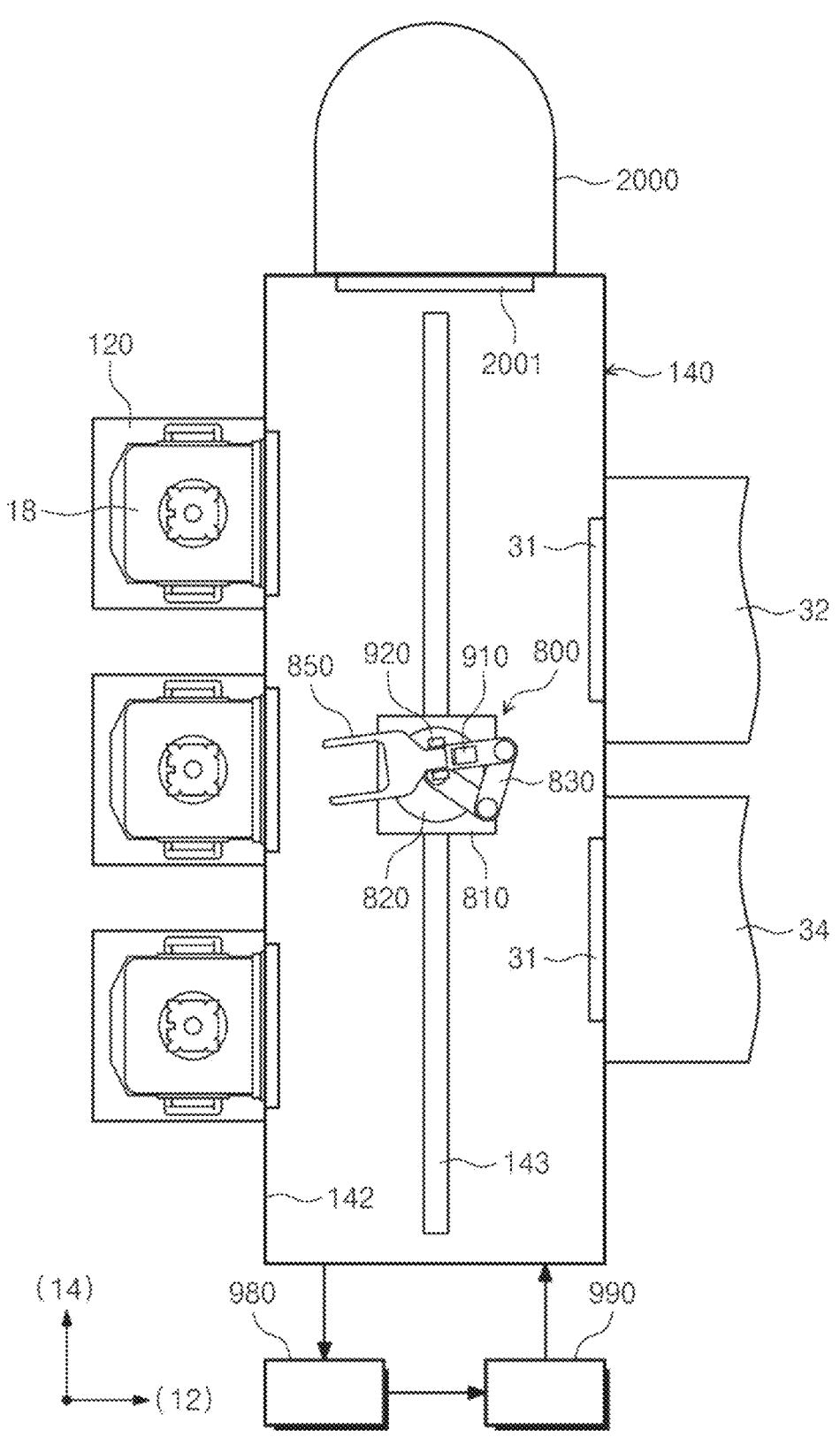
FIGS. 2 and 3 are top plan and side cross-sectional views of an index module illustrated in FIG. 1.
Figure 3:
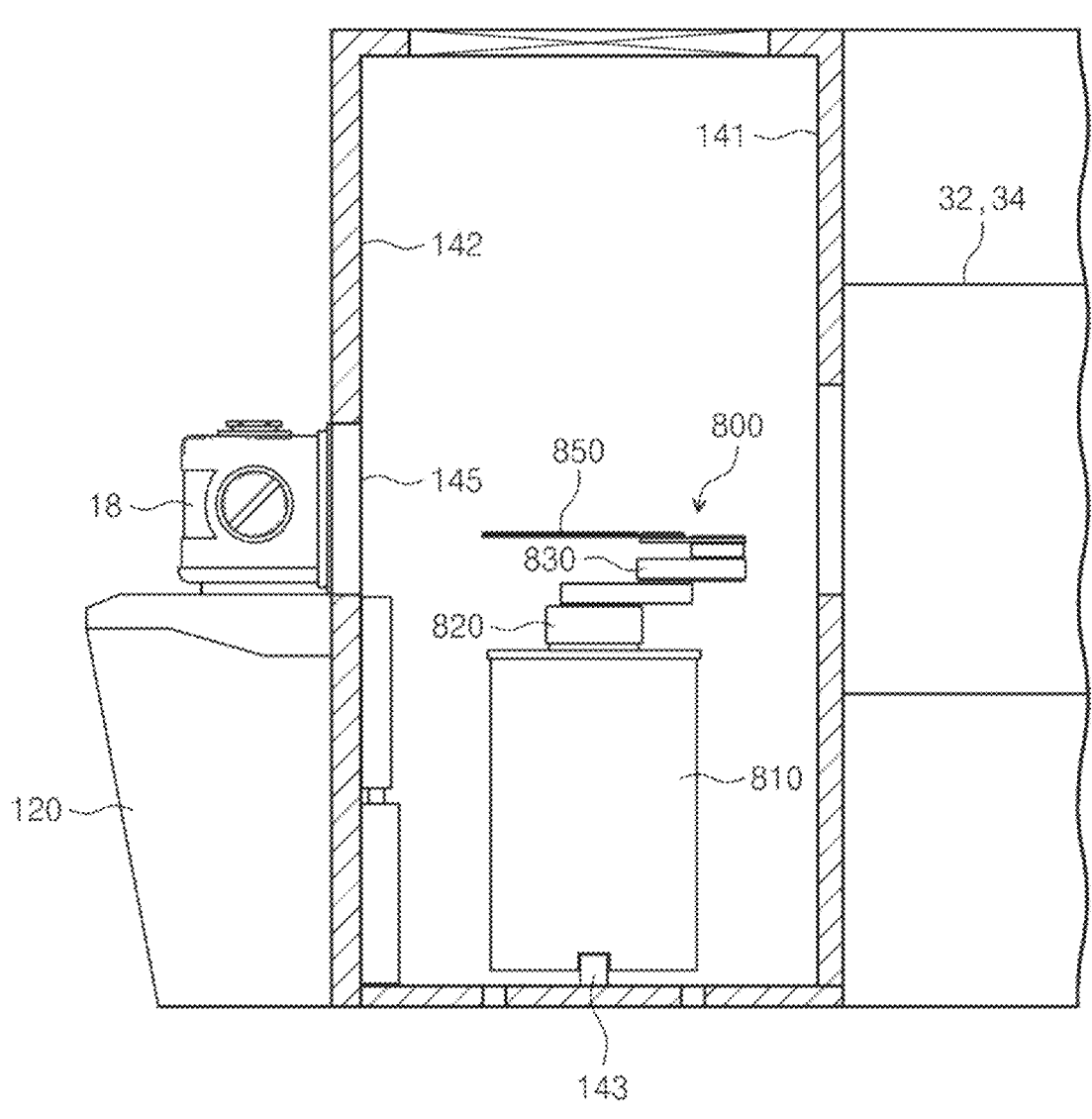

FIG. 1 is a top plan view schematically illustrating a substrate processing apparatus according to one embodiment of the present invention, and FIGS. 2 and 3 are top plan and side cross-sectional views of an index module illustrated in FIG. 1.

Referring to FIGS. 1 to 3, the substrate processing apparatus 1 includes an index module 10, a load lock module 30, and a process module 20.

The index module 10 may include a load port 120, an index chamber 140, and a buffer unit 2000, and the load port 120, the index chamber 140, and the process module 20 may be sequentially arranged in a line.

Hereinafter, a direction in which the load port 120, the index chamber 140, the load lock module 30, and the process module 20 are arranged refers to a first direction 12, a direction perpendicular to the first direction 12 when viewed from the top refers to a second direction 14, and a direction perpendicular to a plane including the first direction 12 and the second direction 14 is referred to as a third direction 16.

A carrier 18 in which a plurality of substrates W are accommodated is mounted on the load port 120. A plurality of load ports 120 are provided and are arranged in a line along the second direction 14. A slot (see FIG. 6) provided to support an edge of the substrate is formed in the carrier 18. A plurality of slots are provided in the third direction 16, and the substrates are stacked in the carrier while being spaced apart from each other in the third direction 16. A front opening unified pod (FOUP) may be used as the carrier 18.

The index chamber 140 has a substantially rectangular shape when viewed from a plane. The index chamber 140 has an index robot 800 therein. The index robot 800 includes a multi jointing arm that can be bent, lifted, and rotated to access a substrate w between the carrier 18 mounted on the load port 120, the buffer unit 2000, and the load lock module 30. An end effector 850 is provided in a front end of the multi jointing arm. The substrate may be mounted on the end effector 850.

An index rail 142 is provided in the index chamber 140. A longitudinal direction of the index rail 142 is provided parallel to the second direction 14. The index robot 800 is installed on the index rail 142, and moves linearly along the index rail 143 in the second direction 14. The index robot 800 includes a base 810, a body 820, and a multi jointing arm 830. The base 810 is installed to be movable along the index rail 142. The body 820 is coupled to the base 810. The body 820 is provided to be movable along the third direction 16 on the base 810.

In addition, the body 820 is provided to be rotatable on the base 810. The multi jointing arm 830 is coupled to the body 820 and can be bent, lifted, and rotated to access the substrate W. The index robot transfers the substrate between the carrier 18, the buffer unit 2000, and the load lock module 30, and the present invention is not limited to the configuration illustrated in FIG. 3.

Two load lock chambers 32 and 34 are connected to one side 141 of the index chamber 140, and a plurality of entrances 145 for introducing substrates are provided in the other side 142 thereof. In the present embodiment, three entrances 145 are provided. An opening/closing door capable of opening or closing may be provided in each of entrances 145. The load port 120 is provided to correspond to each of entrances 145. The carrier 18 that accommodates and transfers the substrate is mounted on the load port 120.

The buffer unit 2000 temporarily stores the substrate W. The buffer unit 2000 performs a process of removing process byproducts remaining on the substrate W. The buffer unit 2000 performs a post-processing process of post-processing the substrate W processed by the process module 20. The post-processing process may be a process of purging a purge gas on the substrate W. A plurality of buffer units 2000 are provided. Each of the buffer units 2000 is disposed to face each other with the index chamber 140 interposed therebetween. The buffer units 2000 are arranged in the second direction 14. The buffer units 2000 are disposed on opposite sides of the index chamber 140, respectively. Optionally, the buffer unit 2000 may be provided in a single manner and may be disposed in one side of the index chamber 140.

The load lock module 30 is disposed between the index chamber 140 and the transfer unit 240. The load lock module 30 replaces a normal pressure atmosphere of the index module 10 with respect the substrate W carried into the process module 20 with a vacuum atmosphere of the process module 20 or replaces the vacuum atmosphere of the process module 20 with respect to the substrate W carried out to the index module 10 with the normal pressure atmosphere of the index module 10. The load lock module 30 provides a space in which the substrate W stays between the transfer unit 240 and the index chamber 140 before transferring the substrate W. The load lock module 30 includes a load lock chamber 32 and an unload lock chamber 34.

In the load lock chamber 32, the substrate W transferred from the index module 10 to the process module 20 temporarily stays. The load lock chamber 32 maintains a normal pressure atmosphere in a waiting state and is blocked from the process module (20), but maintains an open state to the index module 10. When the substrate W is carried into the load lock chamber 32, an inner space thereof is sealed with regard to each of the index module 10 and the process module 20. Then, an inner space of the load lock chamber 32 is replaced from the normal pressure atmosphere to the vacuum atmosphere, and the inner space is opened to the process module 20 while being blocked from the index module 10.

In the unload lock chamber 34, the substrate W transferred from the process module 20 to the index module 10 temporarily stays. The unloaded lock chamber 34 maintains the vacuum atmosphere in the waiting state and is blocked from the index module 10, but maintains an open state to the process module 20. When the substrate W is carried into the unload lock chamber 34, the inner space is sealed with respect to each of the index module 10 and the process module 20. Then, an inner space of the unloaded lock chamber 34 is replaced from the vacuum atmosphere to the normal pressure atmosphere, and the inner space is opened to the index module 10 while being blocked from the process module 20.

The process module 20 may include a transfer unit 240 and a plurality of process chambers 260.

The transfer unit 240 transfers the substrate W between the load lock chamber 32, the unload lock chamber 34, and the plurality of process chambers 260. The transfer unit 240 includes a transfer chamber 242 and a transfer robot 250. The transfer chamber 242 may be provided in a hexagonal shape. Optionally, the transfer chamber 242 may be provided in a rectangular or pentagonal shape. The load lock chamber 32, the unload lock chamber 34, and the plurality of process chambers 260 are disposed around the transfer chamber 242. A transfer space 244 for transferring the substrate W is provided inside the transfer chamber 242.

The transfer robot 250 transfers the substrate W in the transfer space 244. The transfer robot 250 may be disposed in a central part of the transfer chamber 240. The transfer robot 250 may have a plurality of hands 252 that can move in a horizontal direction or a vertical direction and can move forward or backward, or rotate on a horizontal plane. Each of the hands 252 is independently operable, and the substrate W may be mounted on the hand 252 in a horizontal state.

Hereinafter, a plasma processing apparatus 1000 provided in the process chamber 260 will be described. The plasma processing apparatus 1000 will be described as an apparatus for etching the substrate W. However, the plasma processing apparatus 1000 of the present embodiment is not limited to the etching processing apparatus, and may be variously applicable.

Figure 4:
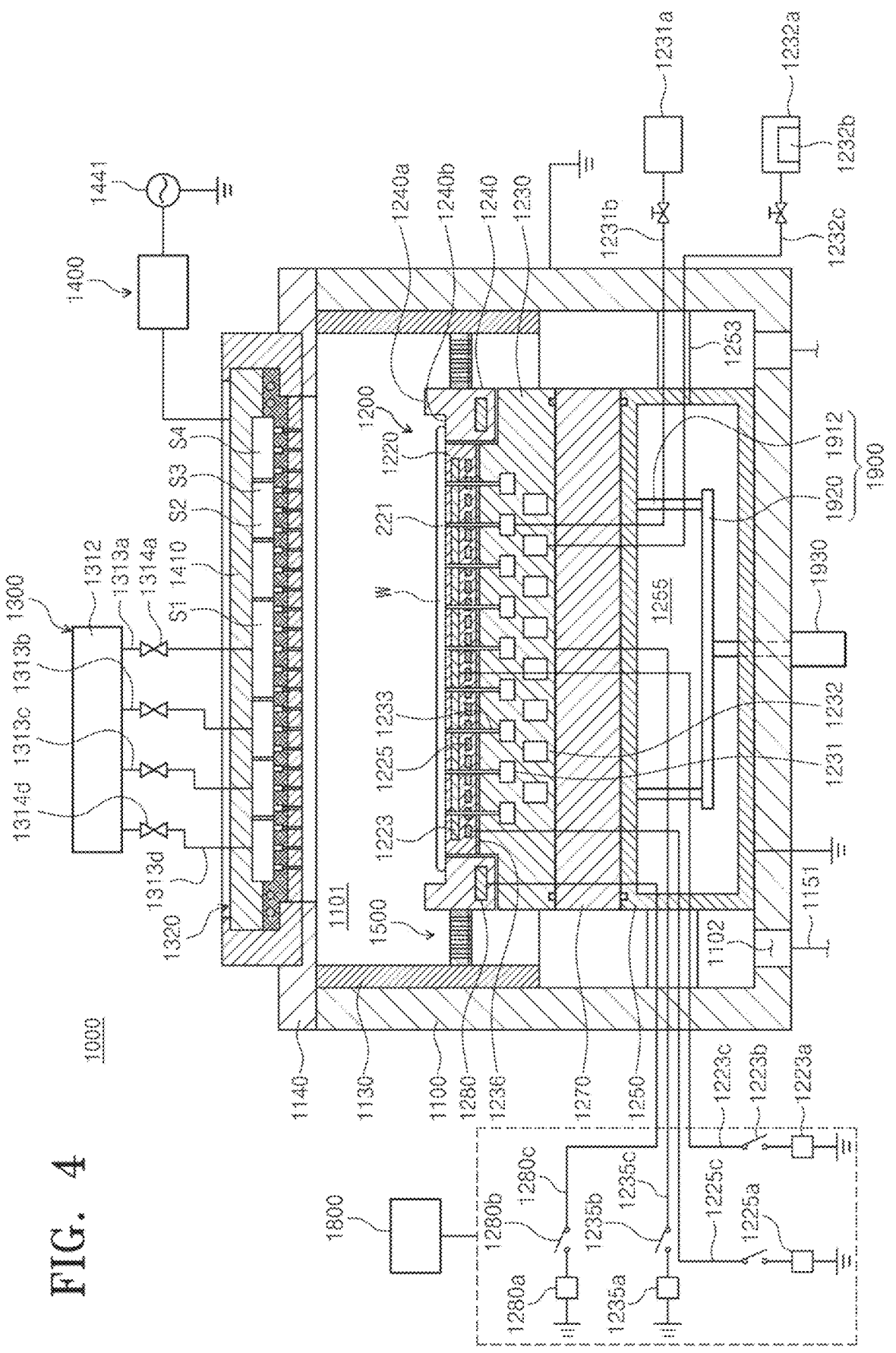
FIG. 4 is a side cross-sectional view of the substrate processing apparatus illustrated in FIG. 1.

FIG. 4 is a cross-sectional view illustrating the process module according to the exemplary embodiment of the present invention.

Referring to FIG. 4, the plasma processing apparatus 1000 processes a wafer W using plasma. As an example of the substrate, a semiconductor wafer (hereinafter, simply referred to as a 'wafer W') is provided. The plasma processing apparatus 1000 may include a process chamber 1100, a substrate support unit 1200, a plasma generation unit 1400, a gas supply unit 1300, a baffle unit 1500, and a controller 1800.

The process chamber 1100 provides a processing space 1101 in which a substrate processing process is performed. The processing space 1101 may be maintained at a process pressure lower than atmospheric pressure, and may be provided as a closed space. The process chamber 1100 may be made of a metal material. For example, the process chamber 1100 may be made of an aluminum material. The surface of the process chamber 1100 may be anodized. The process chamber 1100 may be electrically grounded. An exhaust hole 1102 may be formed on a bottom surface of the process chamber 1100. The exhaust hole 1102 may be connected to an exhaust line 1151. Reaction byproducts generated during the process and gas remaining in an inner space of the chamber may be discharged to the outside through the exhaust line 1151. The inside of the process chamber 1100 may be reduced to a predetermined pressure by an exhaust process.

According to the exemplary embodiment, a liner 1130 may be provided inside the process chamber 1100. The liner 1130 may have a cylindrical shape of which the upper surface and the lower surface are opened. The liner 1130 may be provided to be in contact with an inner surface of the chamber 1100. The liner 1130 can protect an inner wall of the chamber 1100 to prevent the inner wall of the chamber 1100 from being damaged by arc discharge. In addition, the liner 1130 can prevent byproducts generated during the substrate processing process from being deposited on the inner wall of the chamber 1100. The liner 1130 may be exposed to the processing space inside the process chamber 1100 to react with a cleaning gas, and may include a yttria (Y2O3) material.

A window 1140 is provided in an upper part of the process chamber 1100. The window 1140 is provided in a plate shape. The window 1140 seals the processing space 1101 by covers an open upper surface of the process chamber 1100. The window 1140 may include a dielectric substance.

The substrate support unit 1200 is provided inside the process chamber 1100. In one embodiment, the substrate support unit 1200 may be disposed inside the chamber 1100 and spaced apart upwardly from a bottom surface of the chamber 1100 by a predetermined distance. The substrate support unit 1200 may support the wafer W. The substrate support unit 1200 may include an electrostatic chuck ESC including an electrostatic electrode 1223 that adsorbs the wafer W using an electrostatic force. Alternatively, the substrate support unit 1200 may support the wafer W in various ways, such as mechanical clamping. Hereinafter, the substrate support unit 1200 including the electrostatic chuck ESC will be described as an example.

The substrate support unit 1200 may include a susceptor, a base plate 1250, and a lift pin unit 1900. The susceptor can be provided in the form of a module containing a dielectric plate 1220 corresponding to a support plate, an electrode plate 1230 corresponding to a lower electrode, and an insulator plate 1270.

The dielectric plate 1220 may support the wafer W. A perimeter of the dielectric plate 1220 may be surrounded by a focus ring 1240. The dielectric plate 1220 may be disposed in an upper end of the electrode plate 1230. The dielectric plate 1220 may be provided as a dielectric substrate having a disk shape. The wafer W may be placed on an upper surface of the dielectric plate 1220. The upper surface of the dielectric plate 1220 may have a smaller radius than the wafer W. Accordingly, an edge region of the wafer W may be disposed outside the dielectric plate 1220. An edge of the wafer W may be placed on an upper surface of the focus ring 1240.

The dielectric plate 1220 may include the electrostatic electrode 1223, a heater 1225, and a first supply flow path 1221. The first supply flow path 1221 may be formed to penetrate from an upper surface to a lower surface of the dielectric plate 1220. A plurality of first supply flow paths 1221 are formed to be spaced apart from each other, and may be provided as a passage through which a heat transfer medium is supplied to a bottom surface of the wafer W.

The electrostatic electrode 1223 may be electrically connected to a first power source 1223a. The first power source 1223a may include DC power. A switch 1223b may be installed between the electrostatic electrode 1223 and the first power source 1223a. The electrostatic electrode 1223 may be electrically connected to or disconnected from the first power source 1223a by an on/off operation of the switch 1223b. When the switch 1223b is turned on, a DC current may be applied to the electrostatic electrode 1223. The electrostatic force is exerted between the electrostatic electrode 1223 and the wafer W by a current applied to the electrostatic electrode 1223, and the wafer W may be adsorbed to the dielectric plate 1220 by the electrostatic force.

The heater 1225 may be disposed below the electrostatic electrode 1223. The heater 1225 may be electrically connected to a second power source 1225a. The heater 1225 may generate heat by resisting a current applied from the second power source 1225a. The generated heat may be transferred to the wafer W through the dielectric plate 1220.

The wafer W may be maintained at a predetermined temperature by heat generated by the heater 1225. The heater 1225 may include a coil with a spiral shape.

The electrode plate 1230 may be disposed below the dielectric plate 1220. A bottom surface of the dielectric plate 1220 may adhere to an upper surface of the electrode plate 1230 by an adhesive 1236. The electrode plate 1230 may be made of an aluminum material. The upper surface of the electrode plate 1230 may be stepped such that a central region thereof is disposed higher than an edge region thereof. An upper central part of the electrode plate 1230 has an area corresponding to the bottom surface of the dielectric plate 1220, and may adhere to the bottom surface of the dielectric plate 1220. The electrode plate 1230 may have a first circulation flow path 1231, a second circulation flow path 1232, and a second supply flow path 1233 formed therein.

The first circulation flow path 1231 may be implemented with a passage through which the heat transfer medium circulates. The first circulation flow path 1231 may be formed in a spiral shape inside the electrode plate 1230. Alternatively, the first circulation flow path 1231 may be disposed such that ring-shaped flow paths having different radii have the same center. Each of the first circulation flow paths 1231 may communicate with each other. The first circulation flow paths 1231 may be formed at the same height.

The second circulation passage 1232 may be implemented with a passage through which a refrigerant circulates. The second circulation flow path 1232 may be formed in a spiral shape inside the electrode plate 1230. Alternatively, the second circulation flow path 1232 may be disposed such that ring-shaped flow paths having different radii have the same center. Each of the second circulation flow paths 1232 may communicate with each other. The second circulation flow path 1232 may have a cross-sectional area greater than that of the first circulation flow path 1231. The second circulation flow paths 1232 may be formed at the same height. The second circulation flow path 1232 may be formed below the first circulation flow path 1231.

The second supply flow path 1233 may extend upward from the first circulation flow path 1231 and may be provided in an upper surface of the electrode plate 1230. The second supply flow path 1243 may be provided in a number corresponding to the first supply flow path 1221, and may connect the first circulation flow path 1231 and the first supply flow path 1221

The first circulation flow path 1231 may be connected to a heat transfer medium storage unit 1231a through a heat transfer medium supply line 1231b. The heat transfer medium may be stored in the heat transfer medium storage unit 1231a. The heat transfer medium may include an inert gas. According to the exemplary embodiment, the heat transfer medium may include helium (He) gas. The helium gas may be supplied to the first circulation flow path 1231 through the supply line 1231b, and may be supplied to the bottom surface of the wafer W through the second supply flow path 1233 and the first supply flow path 1221. The helium gas may serve as a medium in which heat transmitted from the plasma to the wafer W is transmitted to the dielectric plate 1220.

The second circulation flow path 1232 may be connected to a refrigerant storage unit 1232a through a refrigerant supply line 1232c. The refrigerant may be stored in the refrigerant storage unit 1232a. A cooler 1232b may be provided in the refrigerant storage unit 1232a. The cooler 1232b may cool the refrigerant to a predetermined temperature. Alternatively, the cooler 1232b may be installed on the refrigerant supply line 1232c. The refrigerant supplied to the second circulation flow path 1232 through the refrigerant supply line 1232c may circulate along the second circulation flow path 1232 to cool the electrode plate 1230. While the electrode plate 1230 is cooled, the dielectric plate 1220 and the wafer W may be cooled together to maintain the wafer W at a predetermined temperature. In the exemplary embodiment, the refrigerant may be cooled to 0° C. or less (low temperature) and then supplied. In a preferred embodiment, the refrigerant may be cooled to −30° C. or less (extremely low temperature). In the exemplary embodiment, the refrigerant cools the electrode plate 230 to an extremely low temperature in the range of −30° C. to −100° C., more preferably in the range of −30° C. to −60° C.

The electrode plate 1230 may include a metal plate. For example, the whole electrode plate 1230 may be formed with a metal plate. The electrode plate 1230 may be electrically connected to a third power source 1235a. The third power source 1235a may be provided as a high frequency power source that generates high frequency power. The high-frequency power source may include RF power. The electrode plate 1230 may receive high frequency power from the third power source 1235a. Accordingly, the electrode plate 1230 may function as an electrode, that is, a lower electrode.

The focus ring 1240 may be disposed in an edge region of the dielectric plate 1220. The focus ring 1240 has a ring shape and may be disposed along the perimeter of the dielectric plate 1220. The upper surface of the focus ring 1240 may be stepped such that an outer portion 1240a is formed higher than an inner portion 1240b. The inner portion 1240b of the upper surface of the focus ring 1240 may be disposed at the same height as the upper surface of the dielectric plate 1220. The inner portion 1240b of the upper surface of the focus ring 1240 may support the edge region of the wafer W disposed outside the dielectric plate 1220. The outer portion 1240a of the focus ring 1240 may be provided to surround the edge region of the wafer W.

The focus ring 1240 may control an electromagnetic field such that the density of the plasma is uniformly distributed in a whole region of the wafer W. Accordingly, since plasma is uniformly formed over the whole region of the wafer W, each region of the wafer W may be uniformly etched.

A side electrode 1280 may be provided in the focus ring 1240. The side electrode 1280 is an electrode used in a cleaning process of the chamber 1100. The side electrode 1280 has a ring shape.

The side electrode 1280 may be electrically connected to a fourth power source 1280a. The fourth power source 1280a may be a high frequency power source. However, the present invention is not limited thereto, and any power source capable of converting the cleaning gas into plasma may be used.

The side electrode 1280 may receive high frequency power from the fourth power source 1280a. Accordingly, plasma may be locally generated only on an upper part of the focus ring 1240.

The fourth power source 1235a and the side electrode 1280 may be connected via a fourth power line 1280c, and a switch 1280b may be installed in the fourth power line 1280c. The side electrode 1280 may be electrically connected to or disconnected from the fourth power supply 1280a by an on/off operation of the switch 1280b. When the switch 1280b is turned on while the cleaning gas is supplied to the processing space in the cleaning process of the chamber, a current may be applied to the side electrode 1280, and local plasma may be generated on the upper part of the focus ring 1240 by the current applied to the side electrode 1280. The operation of the switch may be controlled by the controller 1800.

Figure 7:
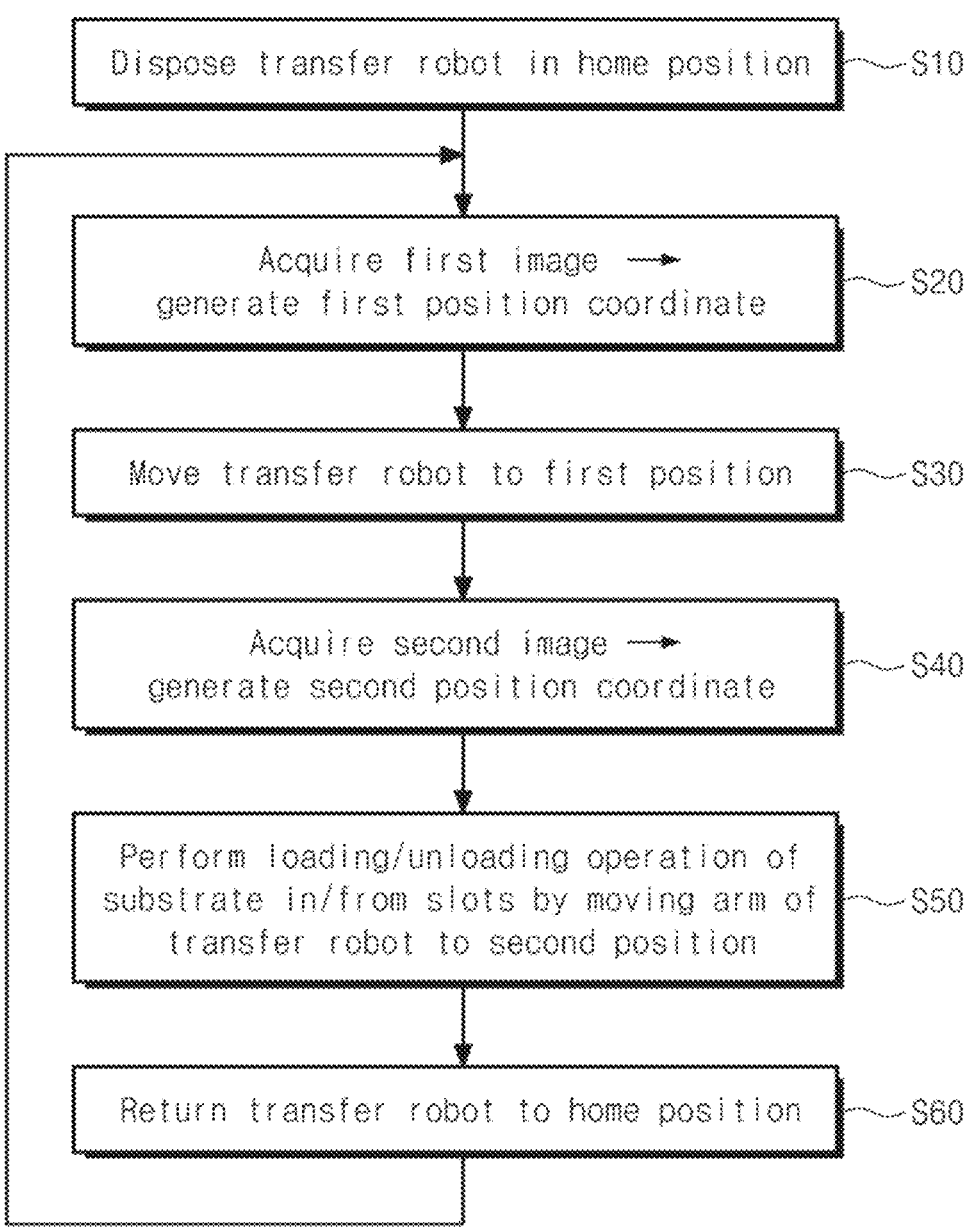
FIG. 7 is a flowchart illustrating a teaching method of the index robot using the transfer position teaching system.

Although it has been illustrated in the exemplary embodiment that the side electrode 1280 is provided in the focus ring 1240, the present invention is not limited thereto. As illustrated in FIG. 7, the side electrode 1280 may be provided between the focus ring 1240 and the electrode plate 1230.

The base plate 1250 may be disposed in a lower end of the substrate support unit 1200. The base plate 1250 may be spaced apart upwardly from the bottom surface of the chamber 1100. A space 1255 may be formed inside the base plate 1250. In the space 1255 formed by the base plate 1250, an air current may communicate with the outside of the space 1255. The outer radius of the base plate 1250 may be provided to have the same length as the outer radius of the electrode plate 1230.

An insulator plate 1270 may be disposed between the dielectric plate 1220 and the base plate 1250. The insulator plate 1270 may cover an upper surface of the base plate 1250. The insulator plate 1270 may be provided in a cross-sectional area corresponding to the electrode plate 1230. The insulator plate 1270 may include an insulator. The insulator plate 1270 may serve to increase an electrical distance between the electrode plate 1230 and the base plate 1250.

The base plate 1250 may have a connection member 1253. The connection member 1253 may connect an outer surface of the base plate 1250 with an inner sidewall of the chamber 1100. A plurality of connection members 1253 may be provided on the outer surface of the base plate 1250 at regular intervals. The connection member 1253 may support the substrate support unit 1200 inside the chamber 1100. In addition, the connection member 1253 may be connected to the inner wall of the chamber 1100 such that the base plate 1250 may be electrically grounded.

A first power line 1223c connected to the first power source 1223a, a second power line 1225c connected to the second power source 1225a, a third power line 1235c connected to the third power source 1235a, the fourth power line 1280c connected to the fourth power source 1280a, the heat transmission medium supply line 1231b connected to the heat transmission medium storage unit 1231a, the refrigerant supply line 1232c connected to the refrigerant storage unit 1232a may extend to the inside of the base plate 1250 through the inner space 1255 of the connection member 1253.

The plasma generation unit 1400 may excite a process gas in the chamber 1100 in a plasma state.

The plasma generation unit 1400 may use a plasma source of a capacitively coupled plasma (CCP) type. When a CCP type plasma source is used, an upper part of the chamber 1100 may include an upper electrode 1410 and an upper power source 1441 that supplies power to the upper electrode 1410.

The upper electrode 1410 may be provided in a disk shape, and is positioned above the substrate support unit. The upper electrode 1410 is electrically connected to the upper power source 1441. The upper electrode 1410 excites the process gas by applying the RF power generated from the upper power source 1441 to the process gas remaining inside the chamber 1100. The process gas is excited and converted into a plasma state. The upper electrode may include a shower head.

The upper electrode 1410 and the electrode plate 1230 may be vertically disposed in parallel with each other with the processing space 1101 interposed therebetween. When power is provided not only to the electrode plate 1230 but also to the upper electrode 1410, an electric field is formed in a space between both electrodes, and the process gas supplied to the space may be excited in a plasma state. The substrate processing process is performed using the plasma. The RF signal applied to the upper electrode 1410 and the electrode plate 1230 may be controlled by the controller 1800.

In the present invention, not only a CCP type plasma source illustrated in the exemplary embodiment but also a plasma source with a inductively coupled plasma type may be applied to the plasma generation unit.

The gas supply unit 1300 may supply the process gas or the cleaning gas into the chamber 1100. The gas supply unit 1300 may include a shower head 1320, gas supply lines 1313a to 1313d, and a gas supply source 1312. The gas supply unit 1300 may supply the process gas during process processing on the substrate, and may supply the cleaning gas during cleaning processing on the chamber.

The process gas supplied by the gas supply unit 1300 may be at least one of $CF_4$ (methane), $H_2$ (hydrogen), HBr (hydrogen bromide), $NF_3$ (nitrogen trifluoride), $CH_2F_2$ (difluoromethane), $O_2$ (oxygen), $F_2$ (fluorine) and HF (hydrogen fluoride), or a combination thereof. Meanwhile, the proposed process gas may be selected differently as necessary despite the exemplary embodiment. The process gas according to the exemplary embodiment of the present invention is excited in a plasma state to etch the substrate.

The cleaning gas supplied by the gas supply unit 1300 is a gas suitable for removing deposits attached to the chamber 1100. The cleaning gas to be supplied may be, for example, a gas including any one of oxygen ($O_2$), an inert gas (e.g., argon gas), fluorine (F), nitrogen ($N_2$), and hydrogen (H).

The baffle unit 1500 may be disposed between the inner wall of the chamber 1100 and the substrate support unit 1200. The baffle 1510 may be provided in a ring shape. A plurality of through holes 1511 may be formed in the baffle 1510. The process gas supplied into the process chamber 1100 may penetrate the through holes 1511 of the baffle 1510, and may be exhausted to the exhaust hole 1102. The flow of process gas may be controlled according to the shape of the baffle 1510 and the shape of the through holes 1511.

The controller 1800 may control an overall operation of the substrate processing apparatus 1000. The controller 1800 may include a central processing unit (CPU), a read only memory (ROM), and a random access memory (RAM). The CPU executes desired processing such as etching processing described below according to various recipes stored in a storage area thereof. Process time, which is a device control information for a process condition, process pressure, high frequency power or voltage, various gas flow rates, a temperature in the chamber (a temperature of the upper electrode, a temperature of the sidewall of the chamber, an electrostatic chuck temperature, etc.), and a temperature of the cooler 1232b are inputted in the recipes. Meanwhile, recipes indicating these programs or processing conditions may be stored in a hard disk or a semiconductor memory. In addition, the recipes may be set at a predetermined position in the storage area while being accommodated in a readable storage medium by a portable computer such as CD-ROM and DVD.

Meanwhile, the lift pin unit 1900 loads the substrate W in the dielectric plate 1220 through ascending and descending movements, or unloads the substrate W from the dielectric plate 1220.

In the process of setting the substrate processing apparatus with the above-mentioned configuration, a teaching operation of the index robot is considerable decisive to accurately transfer the substrate within each module. In the present invention, when positioning (teaching) the movement target of the index robot, high-precision positioning can be automatically performed through vision image processing using an ADAS technique, preventing safety accidents that may occur in manned tasks in facilities and minimizing work time.

Although the teaching operation of the index robot is described in the following embodiment, the present invention is not limited thereto, which can be applied equally to the transfer robot 250 in the process module.

The index robot 800 includes the multi jointing arm that can be bent, lifted, and rotated to access the substrate W between the carrier 18 mounted on the load port 120, the buffer unit 2000, and the load lock module 30. The end effector 850 is provided in the front end of the multi jointing arm. The substrate may be seated on the end effector 850.

The index rail 142 is provided in the index chamber 140. A longitudinal direction of the index rail 142 is provided parallel to the second direction 14. The index robot 800 is installed on the index rail 142, and moves linearly along the index rail 143 in the second direction 14. The index robot 800 includes the base 810, the body 820, and the multi jointing arm 830. The base 810 is installed to be movable along the index rail 142. The body 820 is coupled to the base 810. The body 820 is provided to be movable on the base 810 in the third direction 16.

Figure 5:
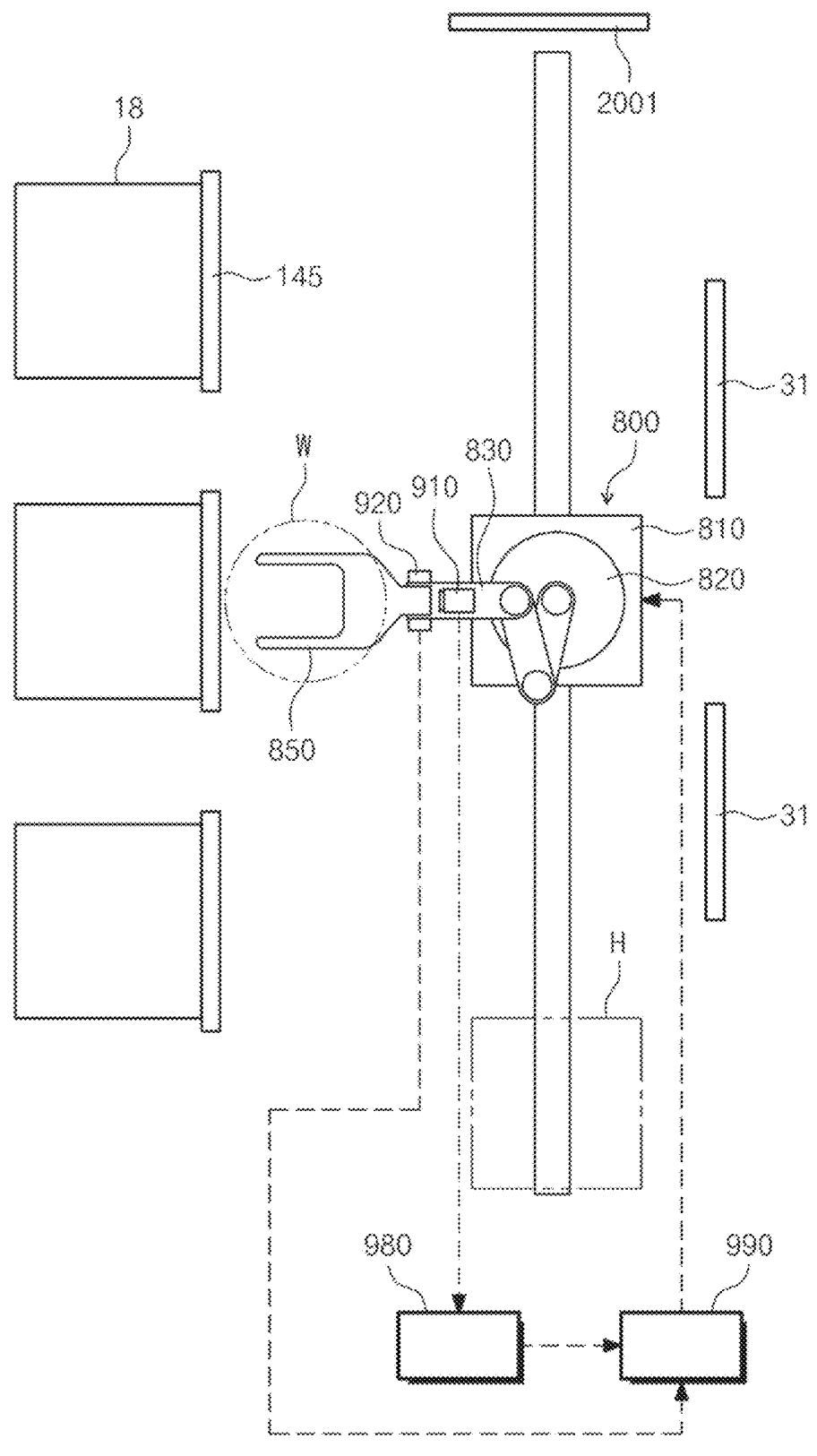
FIG. 5 is a structural view illustrating a transfer position teaching system of an index robot.

FIG. 5 is a structural view illustrating a transfer position teaching system of the index robot.

The transfer position teaching system may include a vision camera 910, a sensor unit 920, an image analysis unit 980, and a robot controller 990.

The vision camera 910 and the sensor unit 920 may be installed in the multi jointing arm 830 of the transfer robot 800. The vision camera 910 may acquire an image by photographing a surrounding area and supply the image to an image analysis unit 980.

The image analysis unit 980 may read an image acquired from the vision camera 910 to calculate a distance to an object, a distance between objects, and coordinates thereof. For example, the image analysis unit 980 may generate position coordinates through an advanced driver assistance system (ADAS) image technique that recognizes objects in the index chamber and measures the distance to the object and the distance between the objects. Here, the object may include a transfer target object in which the index robot transfers the substrate or an entrance to the transfer target object, and in the exemplary embodiment, the object may include the carrier 18 or an opening 145, an entrance 2001 to the buffer unit 2000, and a substrate entrance 31 of the load lock chambers 32 and 34.

The sensor unit 920 may sense proximity to surrounding objects and sense in advance a dangerous situation in which the end effector 850 of the index robot 800 collides with surrounding objects during the teaching process. The information sensed by the sensor unit 920 may be supplied to the robot controller 990. The sensor unit 920 may include at least one selected from the group consisting of a lidar, a radar, and an ultrasonic sensor.

The robot controller 990 controls the movement of the index robot 800 along the coordinates received from the image analysis unit 980.

Figure 6:
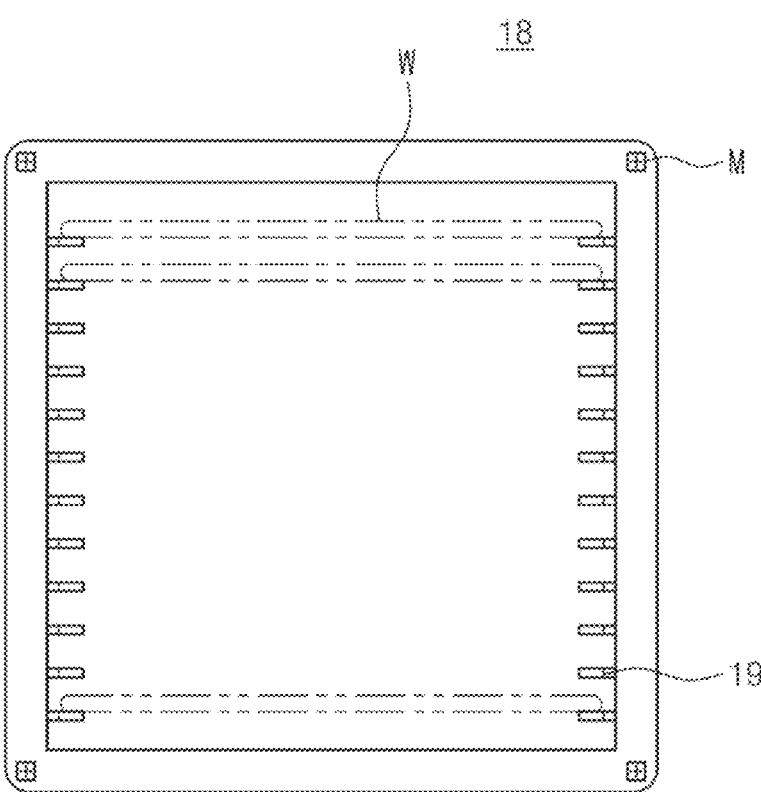
FIG. 6 is a diagram for explaining a carrier.

FIG. 6 is a view for explaining the carrier.

As illustrated in FIG. 6, the carrier 18 includes slots 19 such that a plurality of (e.g., 25 sheets) of substrates may be stacked in multiple stages at predetermined intervals, and displays at least one reference mark M on a front side thereof. The reference mark M helps the image analysis unit 980 to easily calculate position coordinates when reading image data. Preferably, the reference mark M is displayed in a position that can be identified in the index chamber 140 when the carrier 18 is seated on the load port 120 and a carrier door is opened. As another example, the reference mark M may be provided in a position adjacent to the entrance 145 of the index chamber 140.

The teaching operation of the index robot using the transfer position teaching system having the above-described configuration is as follows. Here, the teaching operation of the carrier (a transfer target object) disposed in the middle will be described as an example.

Figure 8A:
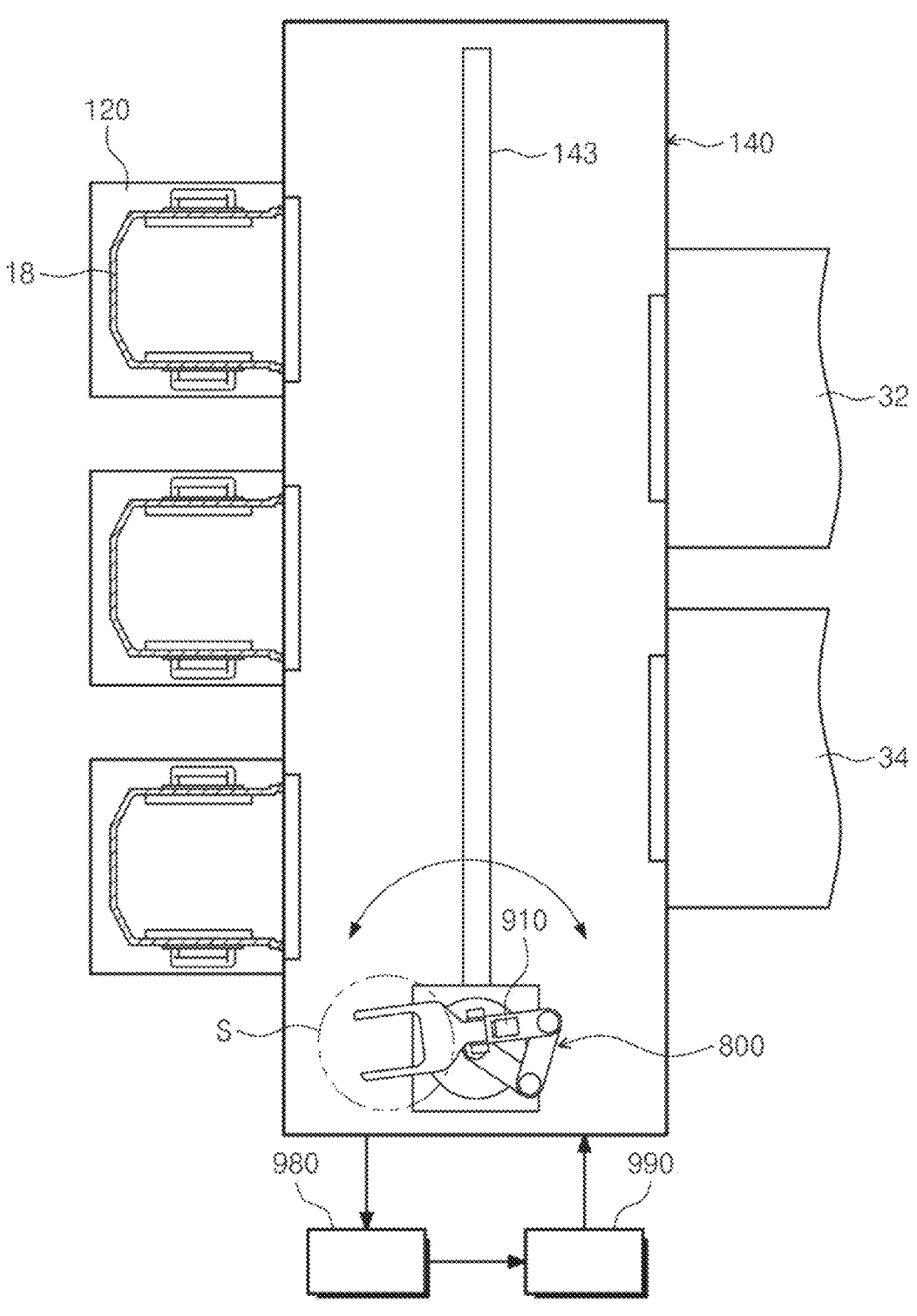
FIGS. 8A to 8C are view illustrating a position of the index robot according to the teaching method of FIG. 7.
Figure 8B:
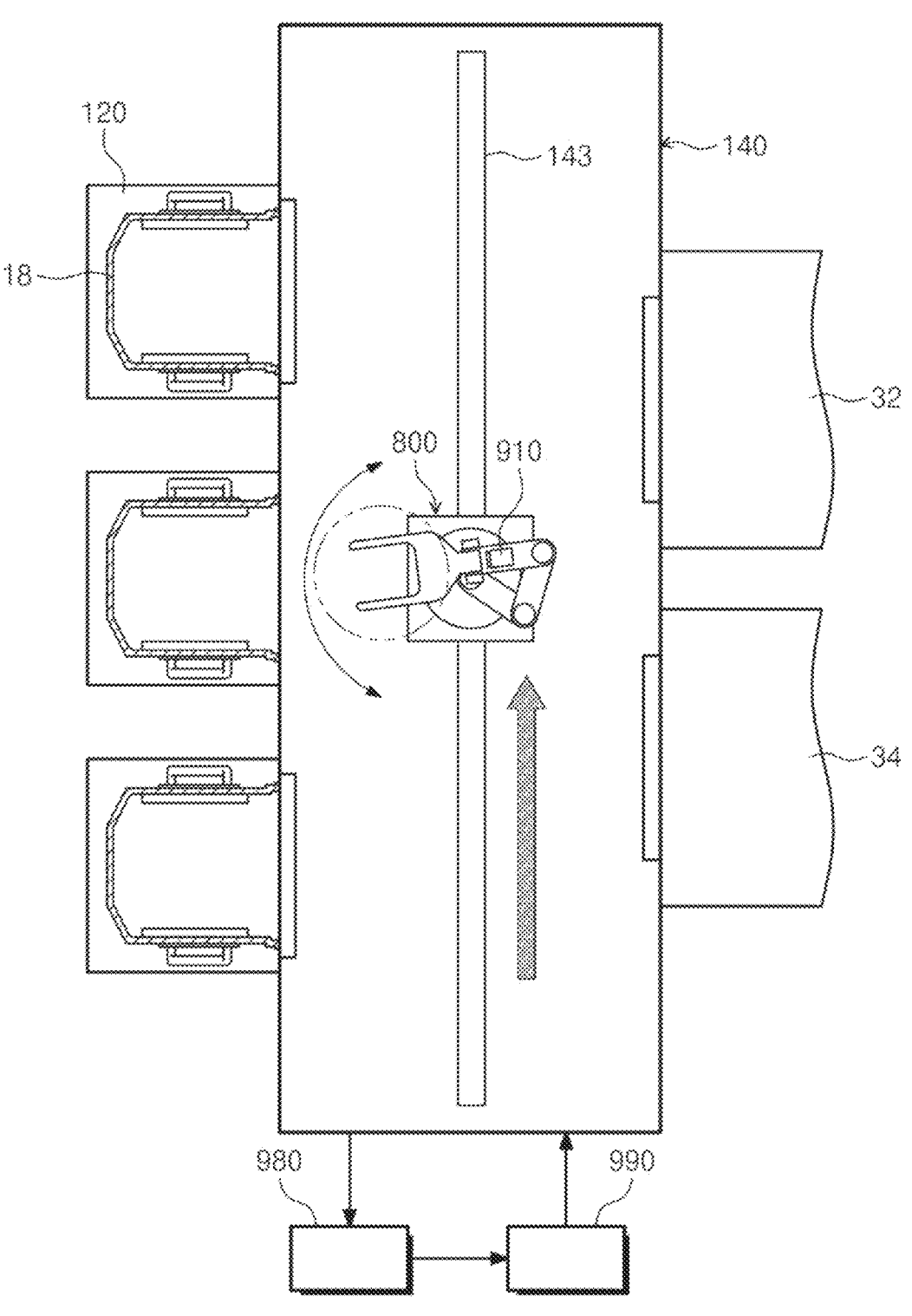
Figure 8C:
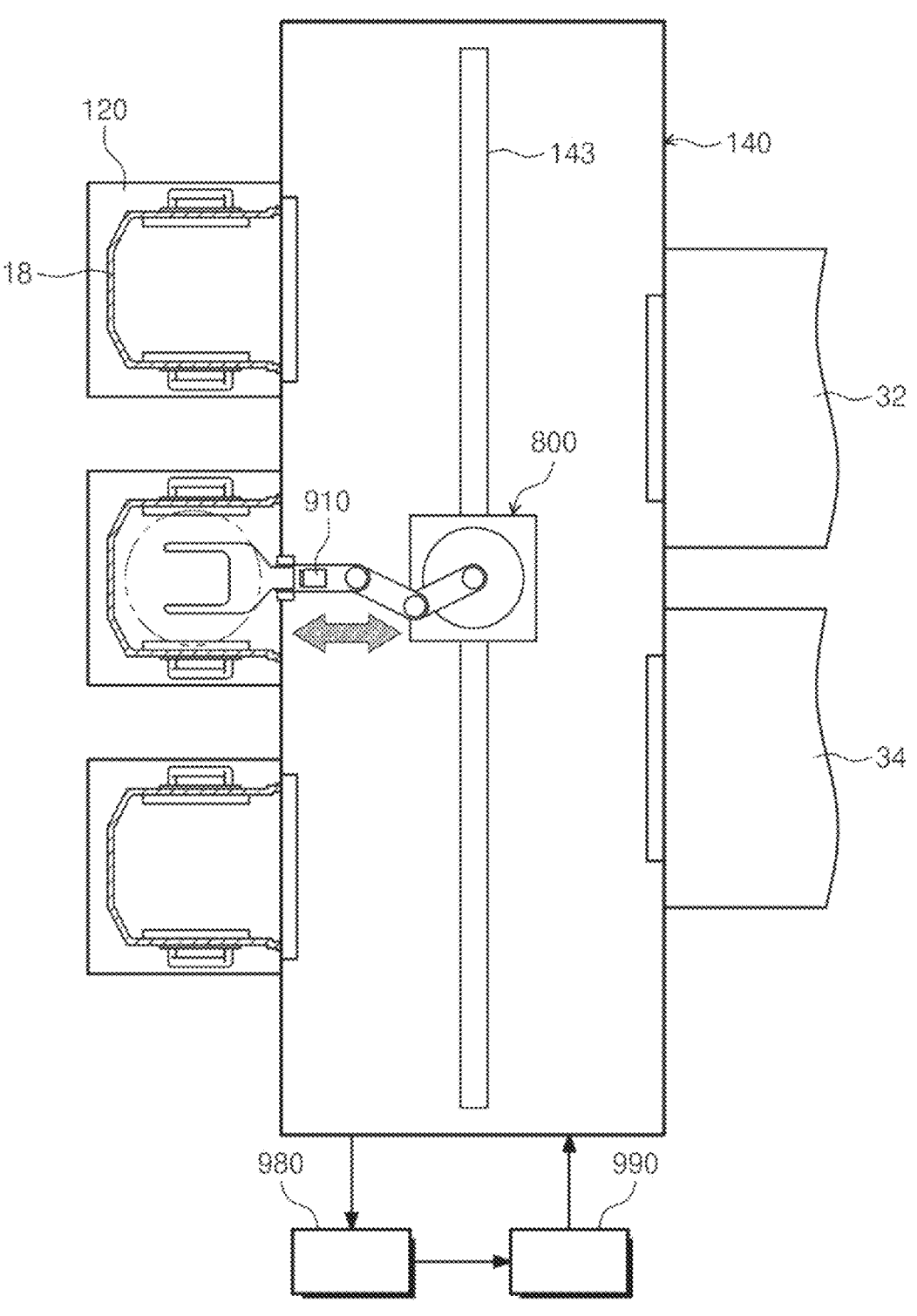

Referring to FIGS. 7 to 8C, (S10) the index robot 800 is positioned in a home position H of the index chamber 140 for the teaching operation. Here, the home position H is a position where the index robot 800 can safely wait, and in general, one end of the index chamber 140 is designated as the home position (see FIG. 8A).

(S20) While the index robot 800 is waiting in the home position H, the vision camera 910 photographs a surrounding image, and the photographed first image is supplied to the image analysis unit 980. When the surrounding image is photographed, the vision camera 910 may be disposed to face objects, and the multi jointing arm 830 may be rotated at a predetermined angle as necessary. The image analysis unit 980 reads the acquired image data, specifies a transfer target object (a second carrier 18) preset to a teaching target, and derives a first position coordinate for the transfer target object (see FIG. 8A).

(S30) The index robot 800 is moved to the first position coordinate (the front of the second carrier) by the robot controller 990 (see FIG. 8B).

(S40) When the index robot 800 is moved to the first position coordinates, the vision camera 910 acquires a second image (a precision image) for the carrier 18, and the image analysis unit 980 reads the acquired image data to derive a second position coordinate. The second position coordinates may include position coordinates for each slot of the carrier 18. In this case, the position of the index robot 800 is precisely corrected (see FIG. 8B).

(S50) The robot controller 990 controls the index robot 800 such that the index robot 800 performs an operation of loading or unloading the substrate in/from the slots of the carrier 18 along the position coordinates for each slot (see FIG. 8C).

(S60) When the teaching operation for the transfer target object (the second carrier) is completed, the index robot 800 returns to the home position H.

Then, steps S20 to S60 are repeatedly performed by specifying a new carrier set to a subsequent teaching target.

Meanwhile, in the above-described teaching process, a dummy substrate may be seated on the end effector of the index robot 800.

The foregoing detailed description illustrates the present invention. In addition, the above description shows and describes the exemplary embodiments of the present invention, and the present invention may be used in various other combinations, modifications, and environments. That is, changes or modifications are possible within the scope of the concept of the invention disclosed herein, the scope equivalent to the written disclosure, and/or within the scope of skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. A transfer position teaching system of a transfer robot, comprising a vision camera installed on an arm of a transfer robot disposed in a home position of a transfer chamber and configured to acquire and output a first image in which a surrounding area is photographed;

an image analysis unit configured to read the first image acquired from the vision camera to identify a transfer target object preset to a teaching target object and generate a first position coordinate in which the transfer robot is located in front of the identified transfer target object; and a controller configured to control a first movement of the transfer robot from the home position to the first position coordinate received from the image analysis unit, the vision camera further configured to acquire and output a second image including the transfer target object based on the transfer robot being in the first position coordinate, the vision camera facing a first direction relative to a base of the transfer robot during acquiring the first image and a second direction relative to the base of the transfer robot during acquiring the second image, the first and second directions being different, the image analysis unit further configured to read the second image and generate a second position coordinate, and the controller configured to control a second movement of the transfer robot from the first position coordinate to the second position coordinate received from the image analysis unit.

2. The transfer position teaching system of a transfer robot of claim 1, wherein the transfer target object includes at least one reference mark, and the image analysis unit is configured to derive position coordinates based on the reference mark when reading the first image and the second image, the position coordinates including the first position coordinate and the second position coordinate.

3. The transfer position teaching system of a transfer robot of claim 2, wherein the image analysis unit is configured to derive the position coordinates through an advanced driver assistance system (ADAS) image technique.

4. The transfer position teaching system of a transfer robot of claim 1, wherein the transfer target object includes slots on which a substrate is loaded, and the second position coordinate includes slot position coordinates for each of the slots.

5. The transfer position teaching system of a transfer robot of claim 4, wherein the controller is configured to control a third movement of the transfer robot such that the transfer robot performs a loading or unloading operation of the substrate in/from the slots of the transfer target object along the slot position coordinates for each of the slots.

6. The transfer position teaching system of a transfer robot of claim 2, further comprising a sensor unit installed in the arm of the transfer robot and configured to sense a collision of the arm with a peripheral facility in advance, wherein the controller is configured to interrupts a teaching operation of the transfer robot when a collision sensing signal is output from the sensor unit.

7. The transfer position teaching system of a transfer robot of claim 6, wherein the sensor unit includes at least one selected from the group consisting of a lidar, a radar or an ultrasonic sensor.

8. The transfer position teaching system of a transfer robot of claim 1, wherein the first movement includes moving the transfer robot by controlling a base of the transfer robot, and the second movement includes moving the arm of the transfer robot and maintaining a position of the base of the transfer robot.

* * * * *